United States Patent [19]
Nishiwaki

[11] Patent Number: 5,946,024
[45] Date of Patent: *Aug. 31, 1999

[54] ILLUMINATING APPARATUS AND DEVICE MANUFACTURING METHOD

[75] Inventor: Masayuki Nishiwaki, Kawaguchi, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/576,459

[22] Filed: Dec. 21, 1995

[30] Foreign Application Priority Data

Dec. 27, 1994 [JP] Japan .................................. 6-340388
Dec. 11, 1995 [JP] Japan .................................. 7-346015

[51] Int. Cl.⁶ .............................. B41J 2/14; H04N 5/225
[52] U.S. Cl. ........................... 347/258; 347/47; 347/207
[58] Field of Search ..................... 347/258, 47; 359/207, 359/618, 619; 29/890.1

[56] References Cited

U.S. PATENT DOCUMENTS

| | | | |
|---|---|---|---|
| 4,093,964 | 6/1978 | Aughton | 358/302 |
| 4,390,235 | 6/1983 | Minoura | 359/204 |
| 4,617,469 | 10/1986 | Takahashi et al. | 250/548 |
| 4,653,903 | 3/1987 | Torigoe et al. | 355/53 |

(List continued on next page.)

FOREIGN PATENT DOCUMENTS

| | | |
|---|---|---|
| 0066432 | 12/1982 | European Pat. Off. . |
| 0454152 | 10/1991 | European Pat. Off. . |
| 0486316 | 5/1992 | European Pat. Off. . |
| 0660158 | 6/1995 | European Pat. Off. . |
| 57-181873 | 11/1982 | Japan . |
| 61-23592 | 1/1987 | Japan . |
| 62-2540 | 1/1987 | Japan . |
| 62-115718 | 5/1987 | Japan . |
| 62-115719 | 5/1987 | Japan . |
| 1-313196 | 12/1989 | Japan . |
| 4-009293 | 1/1992 | Japan . |
| WO93 15911 | 8/1993 | WIPO . |

OTHER PUBLICATIONS

Kremen, "Prism Deflector for Laser Machining," IBM Technical Disclosure Bulletin, vol. 8, No. 6, Nov. 1965, p. 882.
Gagliano, et al., "Lasers in Industry" Proc. IEEE. vol. 57, No. 2, Feb. 1969, pp. 114–147.

(List continued on next page.)

Primary Examiner—Robert E. Nappi
Assistant Examiner—Rajnikant B Patel
Attorney, Agent, or Firm—Fitzpatrick, Cella, Harper & Scinto

[57] ABSTRACT

A laser beam from an excimer laser is split into three beams along a first plane by a pair of prisms and the three beams are caused to intersect each other at the position of the object side focal point of a first cylindrical lens and be incident upon the first cylindrical lens. The three beams are respectively focused independently from each other by the first cylindrical lens. The above focused three beams are then focused along a second plane perpendicular to the first plane by a second cylindrical lens; then, the three beams are caused to superimpose each other on a mask and at the same time are brought to a defocus along the first plane and into focus again along the second plane by an anamorphic optical system containing a third cylindrical lens and a lens having a rotation symmetry, thereby a line-like illumination area extended in the first direction is formed on the mask. The linear illumination area and an area containing a pattern of a series of openings arranged in the first direction or a rectangular pattern extended in the first direction are caused to coincide on the mask to efficiently illuminate the pattern. An image of the illuminated pattern is projected onto a workpiece for an orifice plate by a projection lens system to process the workpiece in accordance with the pattern.

25 Claims, 5 Drawing Sheets

U.S. PATENT DOCUMENTS

| | | | |
|---|---|---|---|
| 4,659,225 | 4/1987 | Takahashi | 356/358 |
| 4,682,885 | 7/1987 | Torigoe | 355/67 |
| 4,683,524 | 7/1987 | Ohta | 362/268 |
| 4,733,944 | 3/1988 | Fahlen et al. | 350/167 |
| 4,851,882 | 7/1989 | Takahashi et al. | 355/46 |
| 4,851,978 | 7/1989 | Ichihara | 362/268 |
| 4,872,747 | 10/1989 | Jalkio et al. | 359/669 |
| 4,874,954 | 10/1989 | Takahashi et al. | 250/548 |
| 4,974,919 | 12/1990 | Muraki et al. | 350/6.6 |
| 5,091,744 | 2/1992 | Omata | 355/53 |
| 5,097,291 | 3/1992 | Suzuki | 355/69 |
| 5,121,160 | 6/1992 | Sano et al. | 355/53 |
| 5,153,773 | 10/1992 | Muraki et al. | 359/619 |
| 5,160,965 | 11/1992 | Koide | 355/202 |
| 5,208,604 | 5/1993 | Watanabe et al. | 346/1.1 |
| 5,251,055 | 10/1993 | Koide | 359/216 |
| 5,263,250 | 11/1993 | Nishiwaki et al. | 29/890.1 |
| 5,270,851 | 12/1993 | Makino et al. | 359/206 |

OTHER PUBLICATIONS

Sowada, et al., "Excimer Laser Material Processing—Methods and Results", Laser Und Optoelektronik, vol. 20, No. 2, Apr. 1988.

Lane, et al., Making Multi–Ink Jet Nozzles and Charging Structures from a Single Sheet of Machinable Plastic IBM Technical Disclosure Bulletin vol. 17, No. 5, Oct. 1974.

Gardner, "Process for Fabrication of Ink Jet Orifices", Xerox Disclosure Journal, vol. 4, No. 2, Mar./Apr. 1979.

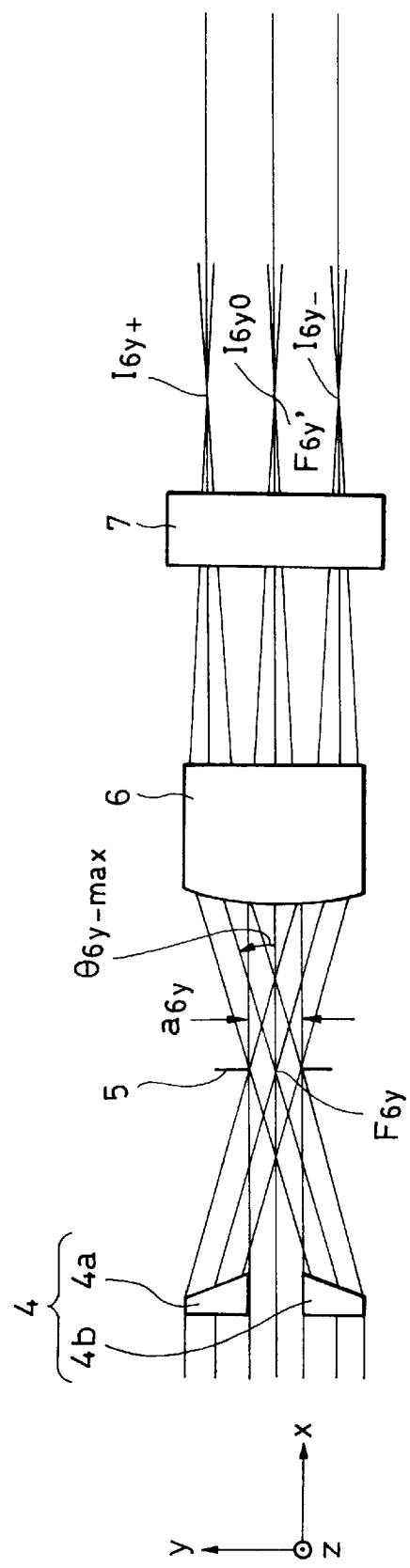
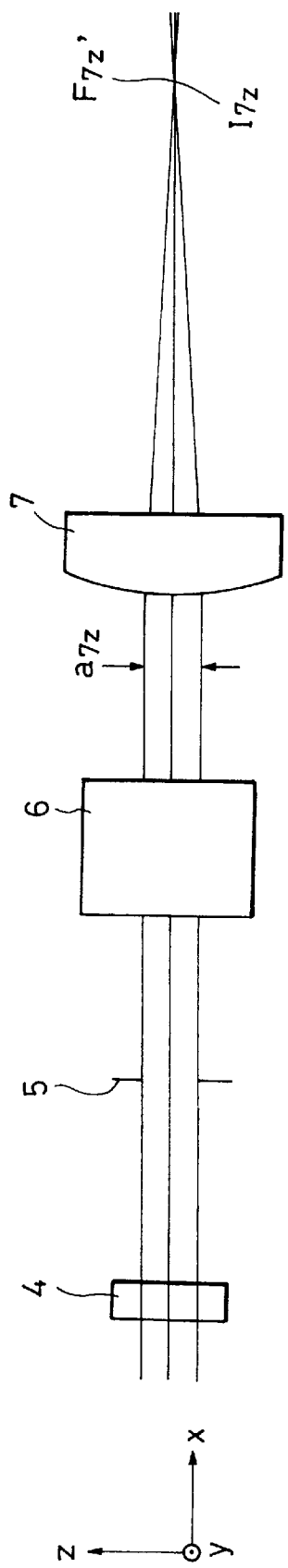

FIG. 4(A)
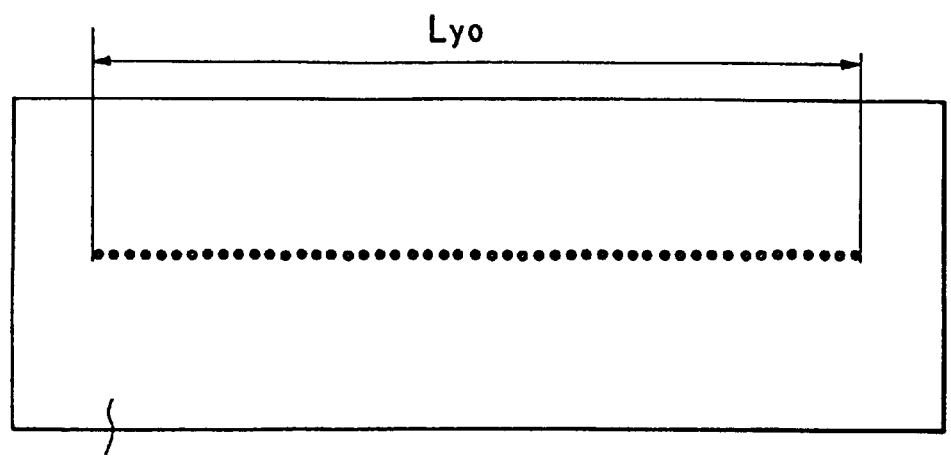

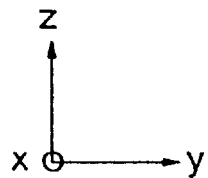
FIG. 5
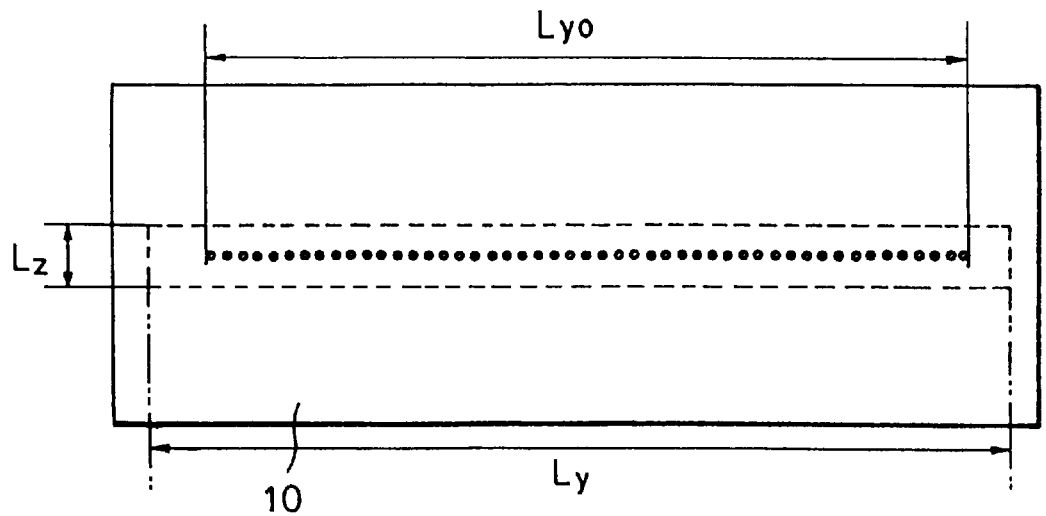

ILLUMINATING APPARATUS AND DEVICE MANUFACTURING METHOD

BACKGROUND OF THE INVENTION

1. Field of the Invention

The present invention relates to illuminating apparatus and device manufacturing methods and, more particularly relates to an illuminating apparatus and a device manufacturing method suitable in processing a nozzle hole or a groove of an ink reservoir of an orifice plate for an ink-jet printer.

2. Description of the Related Art

Recently, it is increasingly common to fabricate a precision part by a mask projection method. Lasers are used as the light source and a pattern on a mask illuminated by a laser beam is projected by a projection lens onto a surface to be processed so that the precision processing is effected by an optical energy of the laser beam which has passed through the pattern. This method is particularly excellent in its high productivity and in that the processing may be effected stably at a high precision.

One of the types of part processing suitably using the mask projection method is the processing of an orifice plate for an ink-jet printer or a bubble jet printer (hereinafter referred to as an ink-jet printer). In general, an ink-jet printer refers to the type of printer in which characters or graphics are printed by intermittently ejecting ink onto a surface of a sheet from a large number of small holes having a diameter of 20 to 50 μm which are arranged in a row. An orifice plate refers to a member having the large number of small holes (nozzles) for ejecting the ink. In order to improve the quality of characters to be printed, it is important, in addition to an accurate control of timing of the ink ejection, that the large number of small holes on the orifice plate be provided at a high precision. Further, in order to lower the cost per unit of the orifice plate, i.e., the cost per unit of printer, it is necessary to improve the productivity in mass production of the orifice plate. If the orifice plate is manufactured by using the mask projection method, it is important to efficiently illuminate the pattern of a mask.

SUMMARY OF THE INVENTION

It is an object of the present invention to provide an illuminating apparatus and a device manufacturing method in which a linear area may be efficiently illuminated.

An illuminating apparatus according to the present invention includes: a first anamorphic optical system for focusing an illuminating beam with respect to a first direction; a second anamorphic optical system for focusing said focused illuminating beam with respect to a second direction substantially perpendicular to said first direction; and a third optical system for bringing the illuminating beam focused with respect to said two directions into focus again with respect to said second direction and at the same time into a defocus with respect to said first direction to form a linear illumination area extended in said first direction on an illuminated surface.

Further, a device manufacturing method according to the present invention includes the steps of: forming said linear illumination area of said illuminating apparatus on a mask; and exposing a workpiece through a pattern within said linear illumination area on said mask.

In an embodiment of the present invention to be described later, said illuminating apparatus includes a beam splitter having a pair of prisms for forming a plurality of beams serving as said illuminating beam by splitting the light from a light source, and the third optical system is so constructed as to cause said plurality of beams to superimpose each other on said illuminated surface and at the same time to bring each of said plurality of beams into focus with respect to said second direction and to a defocus with respect to said first direction on said illuminated surface.

BRIEF DESCRIPTION OF THE DRAWINGS

FIG. 3(A) and 3(B) show in detail the portion from y-direction beam splitting means 4 to second cylindrical lens 7.

FIG. 4(A) is a front view of a mask and

FIG. 5 illustrates the illumination range of a mask pattern.

DESCRIPTION OF THE PREFERRED EMBODIMENTS

Figure 1:
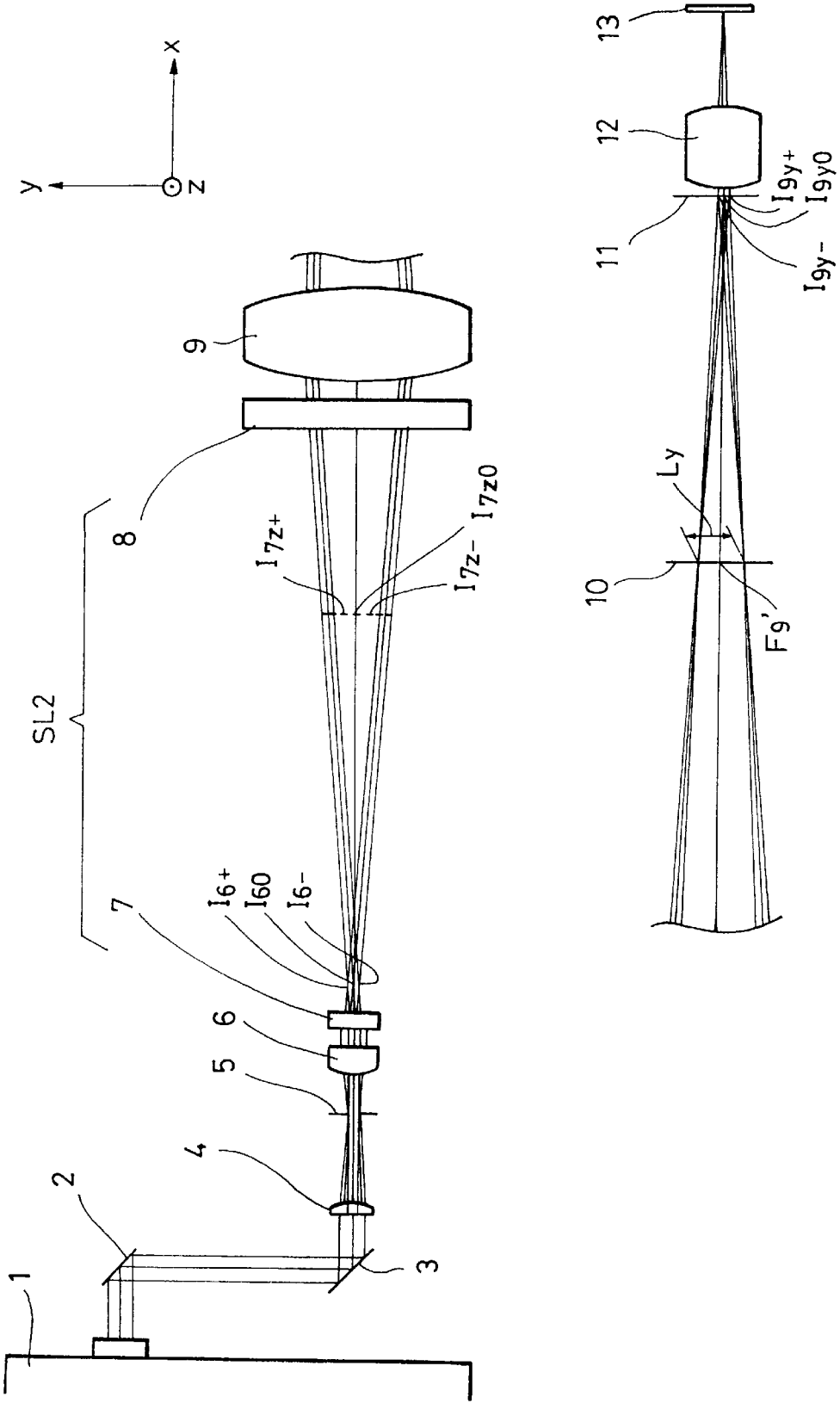
FIG. 1 is a plan view schematically showing certain portions of a first embodiment of the present invention.
Figure 2:
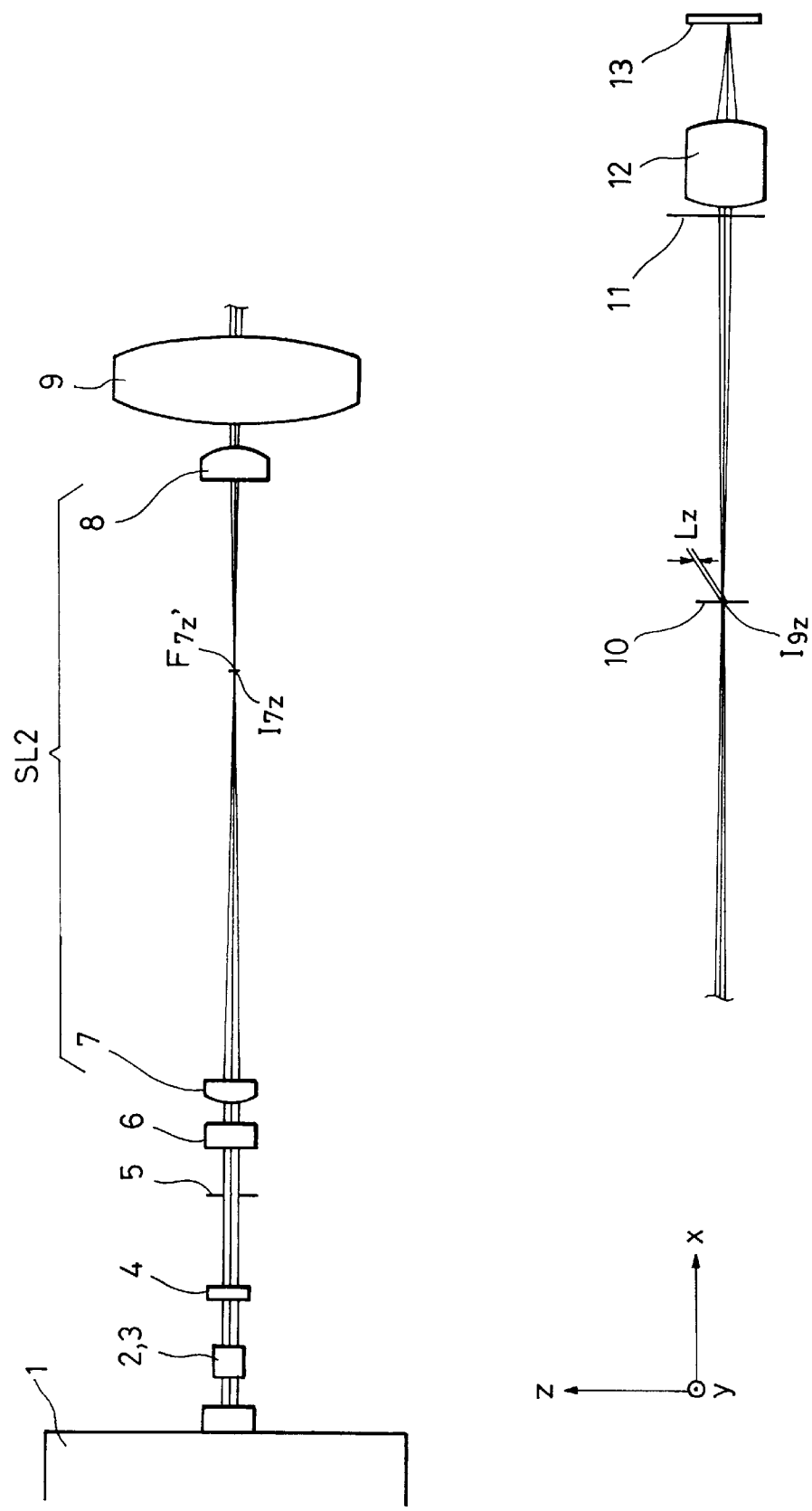
FIG. 2 is a side view schematically showing certain portions of the first embodiment of the present invention.

FIG. 1 is a plan view schematically showing certain portions of a first embodiment of the present invention; and FIG. 2 is a side view of certain portions of the first embodiment of the present invention. For the convenience of explanation, an optical axis of an optical system is defined as an x-axis and x-y-z coordinates are set as having an x-y plane corresponding to the plan view and an x-z plane corresponding to the side view. Here, the y-axis and z-axis are determined to be a first direction and a second direction, respectively, and the x-y plane and x-z plane are determined to be a first plane and a second plane, respectively.

In the figures, what is denoted by numeral 1 is a light source for which a laser such as a KrF excimer laser is used. Numerals 2 and 3 are bending mirrors, respectively, and an a y-direction beam splitting means 4 splits the laser beam into a plurality of beams that are different in direction from each other within the x-y plane. Denoted by numeral 5 is a shield mask and 6 is a first cylindrical lens (first anamorphic optical system) which has a light converging effect only in the y-direction. Denoted by SL2 is a cylindrical lens unit consisting of a second cylindrical lens (second anamorphic optical system) 7 having a light converging effect only in the z-direction and a third cylindrical lens (cylindrical lens unit) 8 having a light converging effect only in the z-direction. Denoted by numeral 9 is an ordinary convex lens (condenser) shaped in a rotation symmetry having a light converging effect in both the y- and z-directions. Numeral 10 is a mask which is disposed on a surface to be illuminated.

Figure 6:
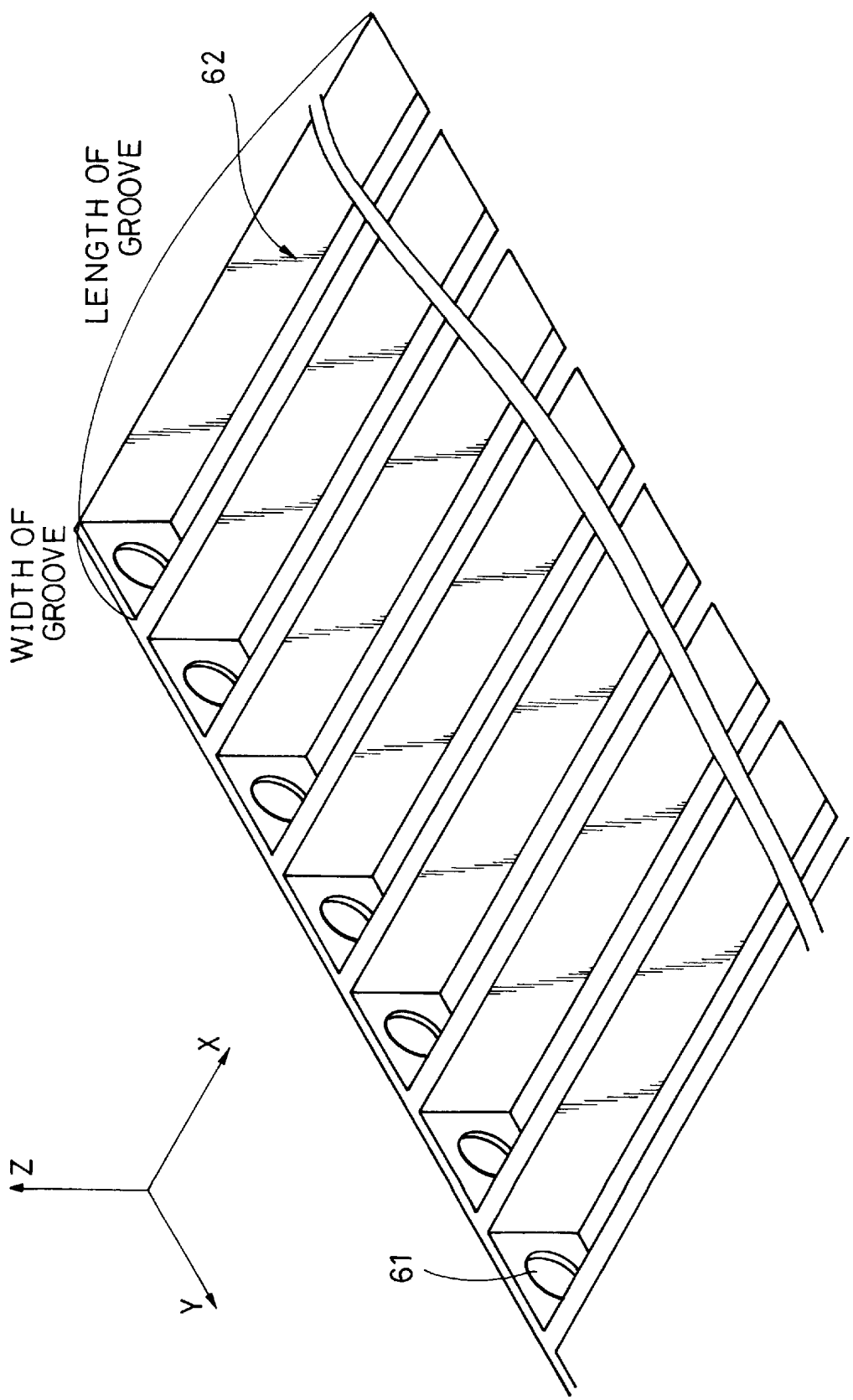
FIG. 6 shows a nozzle and groove of an ink reservoir.

The position of the mask 10 and the image focal point $F_9'$ of the convex lens 9 coincide. Numeral 12 is a projection lens and 11 is an entrance pupil of the projection lens 12 (in some cases, an aperture stop serving as the entrance pupil). Numeral 13 is a workpiece which, in the case of the present embodiment, is a plate consisting of a plastic material to be processed into the orifice plate of an ink-jet printer. The projection lens 12 projects an image of a pattern on the mask 10 (referred to as a mask pattern or projection pattern) onto a surface of the workpiece 13. The orifice plate has an array of nozzle holes 61 as shown in FIG. 6. Further, an ink groove 62 for keeping ink is provided corresponding to each nozzle hole. Accordingly, a pattern arranging small circular openings in a row or a pattern of a slender rectangular opening is provided on the mask 10 so as to be used in the processing of an array of nozzle holes 61 and/or an ink groove 62.

FIGS. 3(A) and 3(B) show in detail the portion of the y-direction beam splitting means 4, shield mask 5, first cylindrical lens 6 and second cylindrical lens 7. FIG. 3A is a plan view and FIG. 3B is a side view.

Figure 4B:
FIG. 4(B) is an enlarged portion of that view.

FIG. 4(A) is a front view of the mask 10 of the present embodiment. The pattern of the mask 10 is in the form of regularly disposing transparent small holes having a diameter $L_{z0}$ (FIG. 4(B)) along a straight line in the y-direction on an opaque background portion, the total length in the y-direction being $L_{y0}$ and the width in the z-direction being $L_{z0}$. The mask 10 is obtained such that a metal film (background portion) such as a chrome film is formed on a transparent substrate and a pattern (array of small holes) is formed by a patterning.

In the present embodiment, the pattern of the mask 10 is projected onto the workpiece (plate member) 13 to form a large number of small holes having a diameter of 20 to 50 μm within a length of about 10 mm on the workpiece.

Supposing the projecting magnification of the projection lens 12 as ⅕, the size of the mask pattern is a pattern where transparent small holes having a diameter of $L_{z0}=0.1\sim0.25$ mm are arranged in a distance of $L_{y0}=50$ mm.

The direction of the length of the mask pattern (y-direction), the beam splitting direction of the y-direction beam splitting means 4, the direction of generating lines of the second cylindrical lens 7 and third cylindrical lens 8 all coincide, and the mask 10 is disposed so that the center of the mask pattern and the x-axis coincide.

The operation of the present embodiment will now be described. The optical operation of the present embodiment will be described in two steps, since the operation in the x-y plane and the operation in the x-z plane are different from each other.

The operation in the x-y plane (first plane) will be first described by way of FIGS. 1 and 3(A). A substantially collimated laser beam emitted in the direction of an optical axis from the light source 1 is a beam having a cross section of which the width in the y-direction is larger than the width in the z-direction. This beam is reflected at the mirrors 2, 3 and is then incident upon the y-direction beam splitting means 4. As shown in FIG. 3(A), the y-direction beam splitting means 4 has two prisms 4a, 4b arranged in the y-direction with a separation from each other and splits the incident beam into three beams that are different in travelling direction from each other within the x-y plane. These beams are not converged nor diverged in the z-direction by the splitting means 4.

The respective central rays (principal rays) of the three split beams intersect at a point $F_{6y}$ on the optical axis, and the shield mask 5 having an opening at the center thereof is disposed at the position $F_{6y}$. The shield mask 5 equalizes the y-direction width of the three split beams to each other and at the same time eliminates stray light occurring prior to the y-direction beam splitting means 4.

The shield mask 5 is disposed at the position of an object focal point $F_{6y}$ (the subscript letters $_{y,z}$ indicating the elements of the y-direction and z-direction, respectively) of the first cylindrical lens 6, thereby the center ray of each beam emitted from the first cylindrical lens 6 becomes parallel to the optical axis. That is, the mask 5 and lens 6 constitute a so-called telecentric optical system. Thus, three images (intermediate images in the x-y plane) $I_{6y+}$, $I_{6y0}$, $I_{6y-}$ are formed at the focal point position $F_{6y}'$ on the image side of the first cylindrical lens 6. In this image formation within the plane, the second cylindrical lens 7 acts simply as a parallel flat plate. It should be noted that these images within the x-z plane are straight line-like images parallel to the z-axis, since each beam is spread in a direction parallel to the z-axis.

Next, the third cylindrical lens 8 also acts simply as a parallel flat plate, and the convex lens 9 forms the above line image $I_{6y+}$, $I_{6y0}$, $I_{6y-}$ into an image $I_{9y-}$, $I_{9y0}$, $I_{9y+}$ on the entrance pupil plane 11 of the projection lens 12. Here, since the position of the mask 10 is the image side focal point of the convex lens 9, all the three beams thereat superimpose each other within the x-y plane at the same time of being defocused. The length of this overlapped portion is defined as $L_y$. The extent $L_y$ is so designed as to sufficiently cover an extent $L_{Y0}$ in the y-direction of the mask pattern as shown in FIG. 5.

The projection lens 12 forms an image of the pattern of the mask 10 illuminated by the three beams on the workpiece 13.

As described, according to the present embodiment, the beam from the laser 1 within the x-y plane is split into three beams and they are respectively formed into an image as a linear light source $I_{6y+}$, $I_{6y0}$, $I_{6y-}$, and its image $I_{9y-}$, $I_{9y0}$, $I_{9y+}$ is formed again within the entrance pupil 11 of the projection lens 12 to achieve a Köhler illumination on the mask 10 and workpiece 13. The mask 10 and workpiece 13 are thus illuminated by a light having a uniform illuminance with respect to the y-direction.

It should be noted that the focal distance $f_{6y}$ of the first cylindrical lens 6 is determined based on the diameter (width) $a_{6y}$ in the y-direction of the beam incident upon the first cylindrical lens 6, the focal distance $f_{9y}$ of the convex lens 9 and the length $L_y$ of the illuminated area on the mask 10. That is, supposing $m_{9y}$ as an image forming magnification by which the convex lens 9 forms an image of the light source image $I_{6y+}$, $I_{6y0}$, $I_{6y-}$ having been formed by the first cylindrical lens 6 on the entrance pupil (aperture of stop) 11, and $b_{9y}$ as the distance from the image side principal plane of the convex lens 9 to the entrance pupil 11 of the projection lens 12, the focal distance $f_{6y}$ of the first cylindrical lens 6 is obtained as:

$$f_{6y}=a_{6y}*\{(b_{9y}-f_9)/L_y\}*|1/m_{9y}| \qquad (1)$$

where "*" indicates a multiplication.

It is desirable that the illumination area $L_y$ of the mask 10 has about the same as or is increased by as much as 20% from the length $L_{y0}$ in the y-direction of the pattern of the mask, i.e.:

$$L_{y0} \leq L_y \leq 1.2*L_{y0}. \qquad (2)$$

To achieve this, it suffices that the focal distance $f_{6y}$ of the first cylindrical lens 6 is determined by setting the incident width $a_{6y}$ of the beam upon the first cylindrical lens 6 as $a_{6y}\sim(a_{6y}/1.2)$, while, in effect, a beam having a width of $a_{6y}$ is caused to be incident thereupon. In other words, the focal distance $f_{6y}$ may be determined by the following equation:

$$f_{6y}=k*a_{6y}*\{(b_{9y}-f_9)/L_{y0}\}*|1/m_{9y}| \qquad (3)$$

where $k=1\sim1/1.2$ and "*" indicates a multiplication.

Next, based on this result, the apex angle (wedge angle) of the two prisms 4a, 4b that constitute the y-direction beam splitting means 4 is calculated. The emitting angle for the y-direction beam splitting means 4 is determined by the focal distance $f_{6y}$ of the first cylindrical lens 6, the diameter $A_{11}$ of the entrance pupil 11 of the projection lens 12, and the image forming magnification $m_{9y}$ in the y-direction of the convex lens 9.

That is, in order that an image of the above three light sources $I_{6+}$, $I_{60}$, $I_{6-}$ be formed within the entrance pupil 11, the following conditions of:

$$\tan(q_{6y-max}) \leq (A_{11}/2)/(f_{6y}*m_{9y}) \qquad (4)$$

must be met, where $\theta_{6y-max}$ is an angle between the optical axis and the beam emitted from the y-direction beam splitting means 4 (see FIGS. 3(A) and 3(B)) and "*" indicates a multiplication.

The two prisms 4a, 4b may be constituted by prisms having an angle of deviation of $\theta_{6y-max}$ as obtained by equation (4).

It should be noted that, in determining their optical disposition, the optical effects of the second cylindrical lens 7 and third cylindrical lens 8 must be considered.

The optical operation of the present embodiment within the x-y plane is as described above.

The operation within the x-z plane (second plane) will now be described by way of FIGS. 2 and 3(B).

In this plane, the y-direction beam splitting means 4 and the first cylindrical lens 6 act only as a parallel flat plate with respect to the incident beam. The incident beam is subjected to a converging effect respectively at the second cylindrical lens 7 and third cylindrical lens 8. Within this plane, the beam from the light source 1 is incident upon the second cylindrical lens 7 as a beam consisting of a bundle of rays that are substantially parallel to each other. A light source image (intermediate image within the x-z plane) $I_{7z}$ is then formed at a focal point position $F_{7z}'$ (second converging point) of the second cylindrical lens 7. Since this light source image is spread into three beams in the y-direction, it is formed as three linear images $I_{7z+}$, $I_{7z0}$, $I_{7z-}$ (see FIG. 1).

Next, these images are subjected to a converging effect by the third cylindrical lens 8 and is furthermore subjected to a converging effect by the convex lens 9 to be focused again at the position of the mask 10.

That is, the three line images $I_{7z+}$, $I_{7z0}$, $I_{7z-}$ are formed into an image again at the position of the mask 10 as one line image $I_{9z}$ by the third cylindrical lens 8 and convex lens 9. The image forming magnification at this time is $m_{8-9,z}$.

The projection lens 12 forms an image of the pattern of the mask 10 illuminated by a beam having a size close to a point in the z-direction on the workpiece 13.

It should be noted that, supposing w as a divergence angle of the laser and $f_{7z}$ as the focal distance of the second cylindrical lens 7, the size in the z-direction $s_{7z}$ of the image $I_{7z}$ formed by the second cylindrical lens 7 is obtained as:

$$S_{7z} = w*f_{7z} \qquad (5)$$

and the size in the z-direction $L_z$ of the image $I_{9z}$ formed on the mask 10 is obtained as:

$$L_z = S_{7z}*m_{8-9,z}$$

$$L_z = w*f_{7z}*m_{8-9,z} \qquad (6)$$

According to the experiments, a suitable range of the size $L_z$ is:

$$3*L_{z0} \leq L_z \leq 30*L_{z0} \qquad (7)$$

where "*" indicates a multiplication.

That is, with respect to the z-direction, the focal distance $f_{7z}$ of the second cylindrical lens 7 and the image forming magnification $m_{8-9,z}$ of the second cylindrical lens 8 and convex lens 9 satisfying equation (6) are determined from the laser divergence angle w and a desired dimension $L_z$, and, then, the focal distance $f_{8z}$ of the second cylindrical lens 8 and the position thereof may be determined.

Thereby, the width of a line-like illumination area may now be varied at a greater degree of freedom by suitably arranging the two cylindrical lenses, i.e., the second and third cylindrical lenses.

It is however preferable that the focal distances $f_{7z}$, $f_{8z}$ of the second cylindrical lens 7 and third cylindrical lens 8 and the positions of the two satisfy the following conditions.

I. The distance from the first cylindrical lens 6 to the convex lens 9 is already determined from the relation of the image formation within the x-y plane. Accordingly, the second cylindrical lens 7 is preferably disposed within this distance. However, the third cylindrical lens 8 may be disposed on either the light source 1 side or the mask 10 side from the convex lens 9.

II. The incident beam is preferably incident upon the entrance pupil 11 of the projection lens 12 without causing a vignetting of the lens. To achieve this, it is preferable to satisfy the following conditions.

$$(d_{10-11}/m_{8-9,z})*(a_{7z}/f_{7z}) \leq A_{11} \qquad (8)$$

where: $a_{7z}$ is the width in the z-direction of the beam incident upon the second cylindrical lens 7; $d_{10-11}$ is a distance from the mask 10 to the entrance pupil 11; and $A_{11}$ is a diameter of the entrance pupil.

It should be noted that, since the line-like images $I_{9y-}$, $I_{9y0}$, $I_{9y+}$ are formed within the entrance pupil 11 and the shape of these images as a whole is rectangular, it is preferable to consider this fact when suitably determining the size or shape of the entrance pupil 11. ("*" indicates a multiplication.)

Based on the above construction, in the present embodiment, the laser beam within the x-z plane is formed into a linear image on the mask 10 as shown in FIG. 5 to achieve a critical illumination while sufficiently covering the dimension $L_{z0}$ in the z-direction of the pattern. Thereby, an illumination having a very high density may be achieved when a pattern is projected on the workpiece.

As described, according to the present embodiment, a Köhler illumination for uniformly illuminating the pattern to be projected is achieved within the x-y plane while sufficiently covering the length in the y-direction thereof, while, in the x-z plane, a critical illumination is achieved for covering the dimension in the z-direction of the pattern to be projected for a suitable range to form (an image in that range with) the beam from the light source into a desired image. Thereby, a projection apparatus is achieved, which is far superior to a conventional laser processing optical system in the efficiency of energy consumption.

The constructing procedure for the projection apparatus will now be described.

First, from the processing dimension on a workpiece and the processing precision thereof, a suitable projection lens and its projecting magnification for processing are determined. Upon the determination of the projection lens, the position and diameter of its entrance pupil are also determined. Then, the pattern of the mask is thereby determined.

Next, upon the determination of the illuminating dimensions $L_y$, $L_z$ on the mask, of the optical elements of the illuminating system, the basic numerical values for the optical elements of the y-direction beam splitting means 4, shield mask 5, first cylindrical lens 6 and convex lens 9 are determined from the equations (3), (4). By satisfying these relations, a laser processing optical system may be achieved, which is capable of providing a uniform illumination in the y-direction.

Next, based on equation (6), the respective focal distance and disposition of the second cylindrical lens 7 and third cylindrical lens 8 for accurately illuminating the z-direction of the mask are determined. Thereby, the pattern to be projected may be accurately illuminated also with respect to the z-direction.

The constructing procedure is as described above. It should be noted that, while, in the present embodiment, the cylindrical lenses are each constructed by a single cylindrical lens, they may be respectively constituted by a plurality of cylindrical lenses.

If the projection apparatus of the present embodiment is applied to the manufacturing of an orifice plate, i.e., an ink-jet printer, the orifice plate may be manufactured at a high productivity. It is thereby possible to reduce the cost of the orifice plate, i.e., of the ink-jet printer.

If, in the above described embodiment, the light source is constructed by something other than a laser, rays of light emitted from the light source are brought into parallel to each other and then may be caused to be incident upon the y-direction beam splitting means 4. Any size larger than the effective portion of the y-direction beam splitting means 4 suffices as the size of a beam to be incident upon the y-direction beam splitting means 4. Further, if no nonuniformity occurs in the intensity distribution of the beam in the y-direction, a system may be constructed without using a y-direction beam splitting means.

It should be noted that, while, in the present embodiment, no beam expanding means or no beam reducing means is provided between the light source 1 and the y-direction beam splitting means 4, the disposition of such means causes no problem if the beam sufficiently covers the effective portion of the y-direction beam splitting means 4. Further, it is also possible to project a mask pattern on the workpiece 13 without an intermediary of a projection lens.

Based on the construction as described above, the present embodiment achieves a projection apparatus suitable for a laser processing optical system which is capable of illuminating a unidimensional line-like mask pattern at a very high efficiency of energy utilization (light utilization efficiency).

Also, an optimal projection apparatus for performing a laser processing of a line-like pattern is achieved, in which, by suitably setting the respective elements of the illumination means, the lengthwise dimension and widthwise dimension of a line-like illumination area may be varied at a high degree of freedom and the respective changes in the first and second directions of the illumination area on the illuminated surface may be made independently while assuring a high energy density.

A projection apparatus is achieved, which is capable of laser processing at a high accuracy by a simple construction by using a beam splitting element, for example, of a prism group, without using a fly-eye lens.

A manufacturing method of an orifice plate is achieved in which the productivity is improved and a lower cost is achieved as a part processing.

A low-cost ink jet printer using a low-cost orifice is achieved.

What is claimed is:

1. An illuminating apparatus for forming a linear illumination area on a surface to be illuminated, said apparatus comprising:

a first anamorphic optical system for bringing an illumination beam into focus with respect to a first direction;

a second anamorphic optical system for bringing the illumination beam into focus with respect to a second direction substantially perpendicular to the first direction; and a third optical system for forming a linear illumination area extended in the first direction on the surface by bringing the illumination beam focused sequentially with respect to the two directions into focus with respect to the second direction and into defocus with respect to the first direction on the surface.

2. An illuminating apparatus for forming a linear illumination area on a surface to be illuminated, said apparatus comprising:

a first anamorphic optical system for bringing an illumination beam into focus with respect to a first direction;

a second anamorphic optical system for bringing the illumination beam into focus with respect to a second direction substantially perpendicular to the first direction;

a third optical system for forming a linear illumination area extended in the first direction on the surface by bringing the illumination beam focused sequentially with respect to the two directions into focus with respect to the second direction and into a defocus with respect to the first direction on the surface; and a beam splitter for forming a plurality of beams serving as the illumination beam by splitting light from a light source, wherein said third optical system causes the plurality of beams to overlap each other on the illuminated surface and brings each of the plurality of beams into focus with respect to the second direction and at the same time to defocus with respect to the first direction on the illuminated surface.

3. An apparatus according to claim 2, wherein said beam splitter directs the plurality of beams to different directions from each other along a first plane containing the first direction and the optical axis such that the plurality of beams intersect each other at a point on the optical axis along the first plane.

4. An apparatus according to claim 3, wherein the intersecting position and the position of an object side focal point of the first anamorphic optical system along the first plane substantially coincide.

5. An apparatus according to claim 4, wherein said beam splitter includes a plurality of prisms.

6. An apparatus according to any one of claims 1 to 5, wherein said first anamorphic optical system is constituted by a single cylindrical lens.

7. An apparatus according to any one of claims 1 to 5, wherein said first anamorphic optical system is constituted by a plurality of cylindrical lenses.

8. An apparatus according to any one of claims 1 to 5, wherein said second anamorphic optical system is constituted by a single cylindrical lens.

9. An apparatus according to any one of claims 1 to 5, wherein said second anamorphic optical system is constituted by a plurality of cylindrical lenses.

10. An apparatus according to any one of claims 1 to 5, wherein said third optical system is an anamorphic optical system.

11. An apparatus according to claim 10, wherein said third optical system includes a cylindrical lens having a refracting power with respect to the first direction and a lens having the same refracting power with respect to the first and second directions.

12. An exposure system having an apparatus according to one of claims 1 to 5, said exposure system forming the linear illumination area on a mask and exposing a substrate through a pattern within the linear illumination area on the mask.

13. An exposure system according to claim 12, further comprising a projection optical system for projecting an image of the pattern of the mask onto the substrate.

14. An exposure system according to claim 13, wherein the focus position of the illumination beam by said first anamorphic optical system and a pupil position of said projection optical system occupy optically conjugate positions.

15. A device manufacturing method comprising the steps of:
bringing an illumination beam into focus with respect to a first direction by a first anamorphic optical system;
bringing the illumination beam into focus with respect to a second direction substantially perpendicular to the first direction by a second anamorphic optical system; and
forming, by a third optical system, a linear illumination area extended in the first direction on a mask by bringing the illumination beam focused sequentially with respect to the two directions into focus with respect to the second direction and into defocus with respect to the first direction on the mask; and
exposing a workpiece through a pattern within the linear illumination area on the mask.

16. A method according to claim 15, wherein the pattern on the mask includes a plurality of small openings arranged along the first direction.

17. A method according to claim 15, wherein the mask includes a rectangular opening having its length direction along the first direction.

18. An orifice plate manufactured by the method according to one of claims 15 to 17.

19. An ink-jet printer having a nozzle hole and/or ink groove manufactured by the method according to one of claims 15 to 17.

20. An illuminating apparatus for forming a linear illumination area on a surface to be illuminated, said apparatus comprising:
an anamorphic optical system for bringing an illumination beam into focus with respect to a first direction and for bringing the illumination beam into focus with respect to a second direction substantially perpendicular to the first direction, sequentially; and
an imaging optical system for forming a linear illumination area extended in the first direction on the surface by bringing the illumination beam focused sequentially with respect to the two directions into focus with respect to the second direction and into defocus with respect to the first direction on the surface.

21. An illuminating apparatus for forming a linear illumination area on a surface to be illuminated, said apparatus comprising:
an anamorphic optical system for bringing an illumination beam into focus with respect to a first direction and for bringing the focused illumination beam into focus with respect to a second direction substantially perpendicular to the first direction, sequentially;
an imaging optical system for forming a linear illumination area extended in the first direction on the surface by bringing the illumination beam focused sequentially with respect to the two directions into focus with respect to the second direction and into defocus with respect to the first direction on the surface; and
a beam splitter for forming a plurality of beams serving as the illumination beam by splitting light from a light source,
wherein said imaging optical system causes the plurality of beams to overlap each other on the illuminated surface and brings each of the plurality of beams into focus with respect to the second direction and to defocus with respect to the first direction on the illuminated surface.

22. A device manufacturing method comprising the steps of:
bringing an illumination beam into focus with respect to a first direction and with respect to a second direction substantially perpendicular to the first direction sequentially by an anamorphic optical system; and
forming, by an imaging optical system, a linear illumination area extended in the first direction on a mask by bringing the illumination beam focused sequentially with respect to the two directions into focus with respect to the second direction and into defocus with respect to the first direction on the mask; and
exposing a workpiece through a pattern within the linear illumination area on the mask.

23. An illuminating apparatus for forming a linear illumination area on a surface to be illuminated, said apparatus comprising:
an anamorphic optical system for bringing an illumination beam into focus with respect to a direction substantially perpendicular to a longitudinal direction of the linear illumination area; and
an imaging optical system for forming the linear illumination area on the surface by bringing the illumination beam focused with respect to said direction into focus with respect to said direction on the surface and to defocus with respect to the longitudinal direction on the surface.

24. An illuminating apparatus for forming a linear illumination area on a surface to be illuminated, said apparatus comprising:
an anamorphic optical system for bringing an illumination beam into focus with respect to a direction substantially perpendicular to a longitudinal direction of the linear illumination area;
an imaging optical system for forming the linear illumination area on the surface by bringing the illumination beam focused with respect to said direction into focus with respect to said direction; and
a beam splitter for forming a plurality of beams serving as the illumination beam by splitting light from a light source,
wherein said imaging optical system causes the plurality of beams to overlap each other on the illuminated surface and brings each of the plurality of beams into focus with respect to said direction and to defocus with respect to the longitudinal direction on the illuminated surface.

25. A device manufacturing method comprising the steps of:

bringing an illumination beam into focus with respect to a direction by an anamorphic optical system; and forming, by an imaging optical system, a linear illumination area on a mask by bringing the illumination beam focused with respect to said direction into focus with respect to said direction on the mask and to defocus with respect to the longitudinal direction on the mask.

* * * * *

UNITED STATES PATENT AND TRADEMARK OFFICE
CERTIFICATE OF CORRECTION

PATENT NO. : 5,946,024

DATED : August 31, 1999

INVENTOR : MASAYUKI NISHIWAKI

Page 1 of 2

It is certified that error appears in the above-identified patent and that said Letters Patent is hereby corrected as shown below:

ON THE COVER PAGE AT ITEM [56] "FOREIGN PATENT DOCUMENTS":
"61-23592 1/1987 Japan" should read --61-23592 2/1986 Japan--.

COLUMN 1:
Line 18, "an" should be deleted.

COLUMN 2:
Line 14, "FIG." should read --FIGS.--; and
Line 38, "an" should be deleted.

COLUMN 3:
Line 6, "FIG. 3A" should read --FIG. 3(A)--; and
Line 7, "FIG. 3B" should read --FIG. 3(B)--.

UNITED STATES PATENT AND TRADEMARK OFFICE
CERTIFICATE OF CORRECTION

PATENT NO. : 5,946,024

DATED : August 31, 1999

INVENTOR : MASAYUKI NISHIWAKI

It is certified that error appears in the above-identified patent and that said Letters Patent is hereby corrected as shown below:

COLUMN 6:
Line 53, "K" should be deleted; and
Line 54, "öhler" should read --Köhler--.

Signed and Sealed this

Thirteenth Day of June, 2000

Attest:

Q. TODD DICKINSON

*Attesting Officer*    *Director of Patents and Trademarks*